Figure 1:
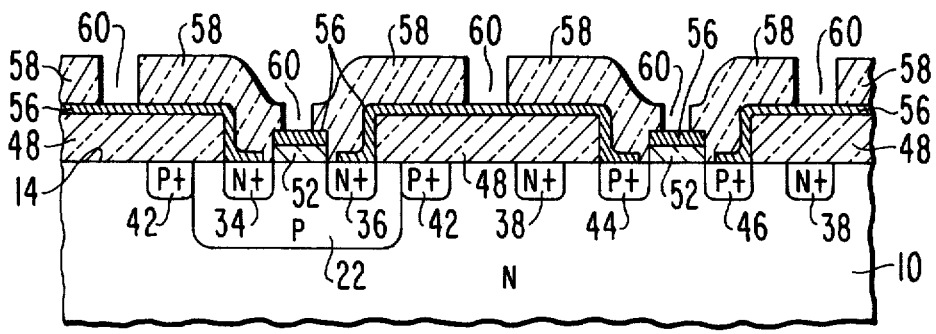

United States Patent [19]
Lambert

[11] 4,046,606
[45] Sept. 6, 1977

[54] SIMULTANEOUS LOCATION OF AREAS HAVING DIFFERENT CONDUCTIVITIES

[75] Inventor: Herbert Paul Lambert, Morrisville, Pa.

[73] Assignee: RCA Corporation, New York, N.Y.

[21] Appl. No.: 684,967

[22] Filed: May 10, 1976

[51] Int. Cl.² .............. H01L 21/225; H01L 21/26
[52] U.S. Cl. ............................ 148/187; 148/1.5; 148/188
[58] Field of Search .............. 148/1.5, 187, 188

[56] References Cited
U.S. PATENT DOCUMENTS

| 3,673,679 | 7/1972 | Carbajal et al. | 148/187 X |
| 3,730,778 | 5/1973 | Shannon et al. | 148/187 X |
| 3,759,763 | 9/1973 | Wang | 148/187 X |
| 3,806,371 | 4/1974 | Barone | 148/1.5 |

Primary Examiner—G. Ozaki
Attorney, Agent, or Firm—H. Christoffersen; R. P. Williams; Sanford J. Asman

[57] ABSTRACT

The process employs both silicon dioxide and silicon nitride layers used for selectively masking areas to be etched in order to allow a single photomask to be used for defining areas having different conductivities simultaneously, thereby eliminating problems caused by misregistry between photomasks.

7 Claims, 10 Drawing Figures

SIMULTANEOUS LOCATION OF AREAS HAVING DIFFERENT CONDUCTIVITIES

The present invention relates to a process for making semiconductor devices.

Semiconductor devices which include a metal, an insulator, and a semiconductor composite structure are extremely important in the manufacture of integrated circuits which are widely used for a variety of purposes. Such integrated circuits employ techniques providing a very large number of transistor devices on a small area of semiconductor material, generally silicon. A problem which exists in the manufacture of such devices relates to the alignment of photomasks which are used to define the areas in which various types of impurities are introduced into the semiconductor material. The problem is compounded by the fact that a single photomask is generally used to define the area where all contacts will be made to the transistor. In view of the fact that separate photomasks are generally used to define the P+ and N+ areas for diffusion purposes and a single mask is used for the contact areas to define the areas where contact will be made to both the P+ and N+ areas, misregistration of the photomasks used to define the P+ and the N+ areas results in lack of alignment between those areas and the contact areas.

IN THE DRAWINGS

FIG. 1 is a cross-sectional view of a COS/MOS device made in accordance with the present invention; and FIGS. 2-10 are cross sectional views describing the procedure used to form the device shown in FIG. 1.

Referring now to FIG. 1, a COS/MOS integrated circuit made in accordance with the present invention is shown. The device is comprised of a body 10 of N type semiconductor material having a P well 22 formed therein. An N+ source 34 and an N+ drain 36 of an N channel transistor are formed in the P well 22, and the P well 22 is surrounded by a P+ guardband 42. P+ regions forming the drain 44 and source 46 of a P channel transistor are formed in the substrate 10. An N+ guardband 38 surrounds the P+ regions 44, 46. Thin channel oxides 52 overlie the channel region between the drain and source of the N channel and P channel transistors. Thick field oxide layers 48 overlie the portions of the substrate 10 in the field regions surrounding regions where active devices are formed. Metallic interconnects and gates 56 overlie the oxide layers 48, 52 and are protected by a protective oxide layer 58 having bond pad openings 60 formed therein.

Referring now to FIGS. 2-10 the novel method of fabricating the device shown in FIG. 1 will be explained. The process relies upon the fact that silicon dioxide layers can be formed either by "growing" thermal silicon dioxide outward from a silicon surface or by depositing silicon dioxide onto an exposed surface. The process further relies upon the fact that there are materials, such as silicon nitride, which can be formed on the surface of silicon, and which can be etched preferentially over silicon dioxide. In addition, silicon dioxide can be preferentially etched over such materials.

The term "preferentially etched" is used herein to mean that if two materials are exposed to the same etchant, the one that is preferentially etched will be removed by the etchant at a rate much greater than the rate the other material is removed. Accordingly, an etchant which preferentially etches silicon nitride with respect to silicon dioxide will remove silicon nitride at a rate much greater than the rate at which it removes silicon dioxide and will be essentially self-limiting if the silicon nitride layer being etched overlies a silicon dioxide layer. Similarly, an etchant which preferentially etches silicon dioxide will be self-limiting if it is used to etch a silicon dioxide layer overlying a silicon nitride layer.

Figure 2:
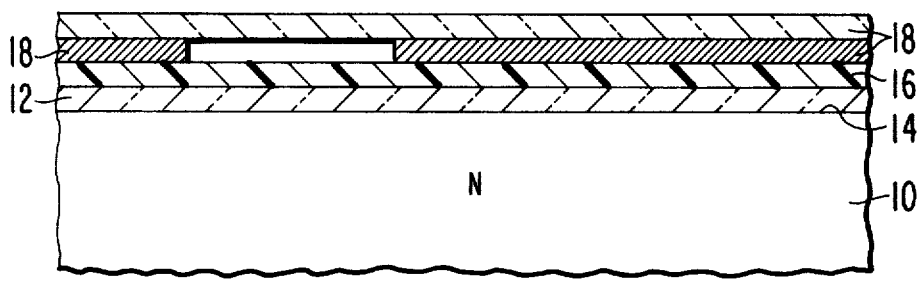

With reference to FIG. 2, a portion of the silicon wafer 10 used in manufacturing the COS/MOS integrated circuit of FIG. 1 is shown. The wafer 10 used in the preferred embodiment of the invention is N type and has its surface oriented substantially parallel to the (100) crystallographic plane. A layer of silicon dioxide 12 is formed on the surface 14 of the wafer 10 by any desired method. For example, the layer 12 can be thermally grown in the presence of oxygen and a small quantity of steam and HCl in a furnace heated to 1000° C.

Following the formation of the silicon dioxide layer 12, a layer 16 of photoresist material is applied to the surface of the layer 12 and a first photomask 18 is used to define areas in which P wells, which form the substrates of N channel transistors, are to be formed. Using standard photolithographic techniques, well known in the semiconductor industry, the photoresist layer 16 is exposed through the mask 18 and then developed to remove those portions of the photoresist layer 16 overlying regions where P wells are to be formed.

An etchant, such as buffered hydrofluoric acid, is used to remove the areas of the silicon dioxide layer 12 exposed by the development of the photoresist layer 16. Then, the balance of the photoresist layer 16 is removed.

Figure 3:
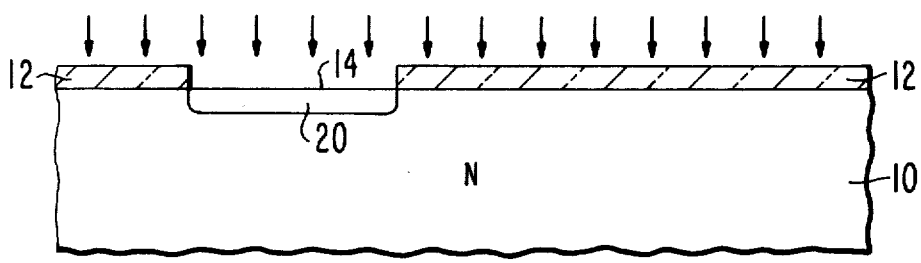
Figure 4:
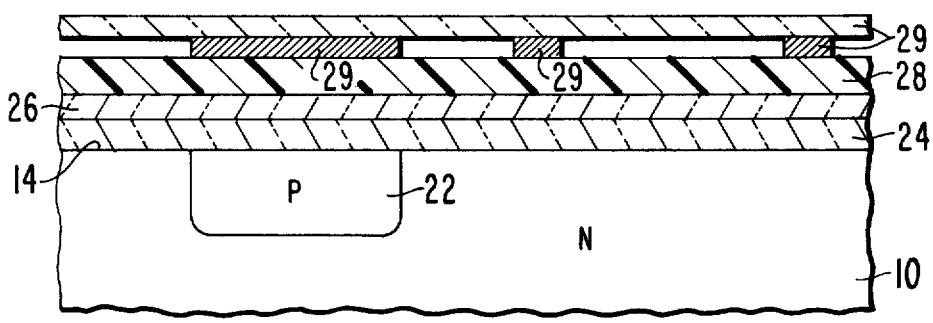
Figure 5:
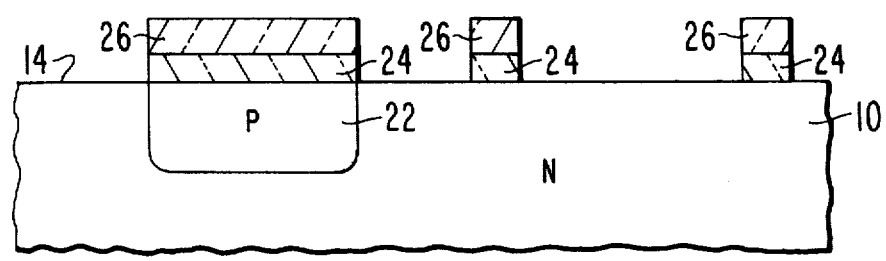

Referring now to FIG. 3, the surface 14 of the wafer 10 is then subjected to an ion implantation of an acceptor type impurity such as boron in order to form a shallow P type region 20. Thereafter, the wafer 10 is placed in a furnace heated to about 1200° C for about 8 hours to drive the impurities from region 20 into the wafer 10 thereby to form a P well 22 as shown in FIG. 4. Following the formation of the P well 22, the remainder of the silicon dioxide layer 12 is removed.

A layer of silicon nitride 24 is then formed over the surface 14 in any desired manner, such as by the pyrolytic decomposition of silane (SiH$_4$) and ammonia (NH$_3$) at approximately 1000° C. Over the silicon nitride layer 24, a silicon dioxide layer 26 is deposited, preferably by the decomposition of silane in an oxidizing atmosphere. Then a photoresist layer 28 is applied to the surface of the silicon dioxide layer 26, and a second photomask 29 is aligned over the surface of the photoresist layer 28. The second photomask 29 is used to define protective covers for the P wells and the N+ guardbands. Following the development of the photoresist layer 28 the exposed portions of the silicon dioxide layer 26 are removed by an etchant which preferentially etches silicon dioxide with respect to silicon nitride in order to expose portions of the silicon nitride layer 24. Then, an etchant which preferentially etches silicon nitride with respect to silicon dioxide and silicon is used to remove the exposed portions of the silicon nitride layer 24, in order to obtain the structure shown in FIG. 5. An example of an etchant which preferentially etches silicon dioxide with respect to silicon nitride is buffered hydrofluoric acid, and example of an etchant which preferentially etches silicon nitride with respect to silicon dioxide is hot phosphoric acid.

Figure 6:
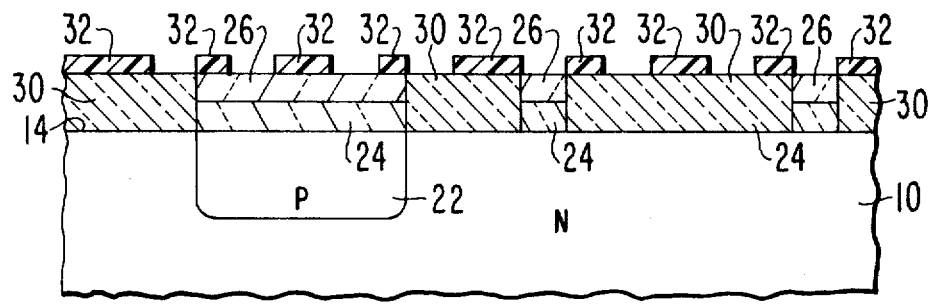

With reference to FIG. 6, the exposed portions of the surface 14 of the wafer 10 are then covered with silicon dioxide. This may be accomplished either by depositing silicon dioxide or by placing the wafer 10 in a furnace in an oxidizing ambient for a time sufficient to grow silicon dioxide layers 30 over the regions of the wafer which have been exposed. In the preferred embodiment, the silicon dioxide layers 30 are thermally grown. A layer of photoresist material 32 is then applied over the surface of the wafer 10, and using a third photomask (not shown) opening in the photoresist layer 32 are defined where N+ and P+ diffusions will be made.

Figure 7:
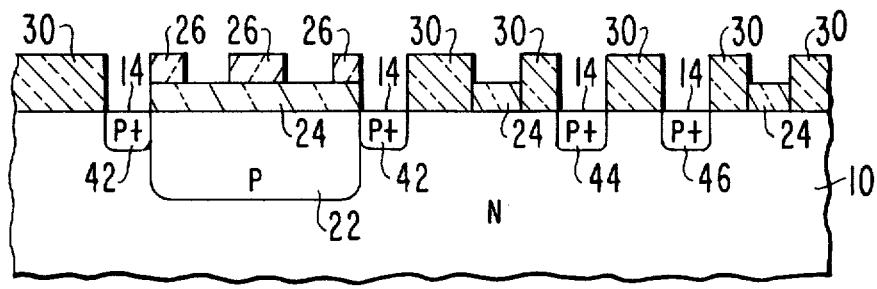
Figure 8:
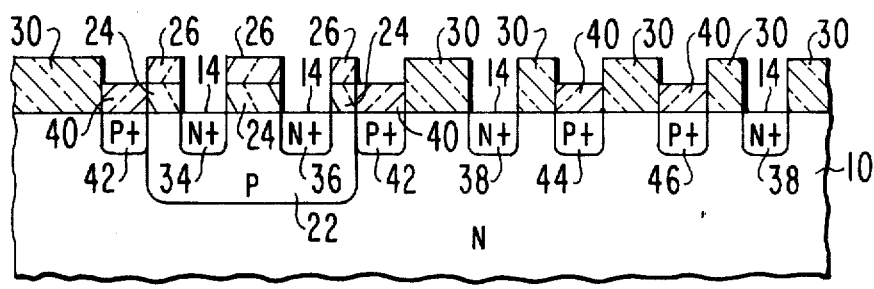

With reference now to FIG. 7, an etchant which preferentially etches silicon dioxide with respect to silicon nitride is used to remove the exposed portions of the silicon dioxide layers 26, 30 thereby to expose both the portions of the silicon nitride layer 24 under the layer 26 and the surface 14 of the wafer 10 underlying the layer 30. Then, the remaining portions of the photoresist layer 32 are removed and an acceptor type impurity, such as boron, is diffused into the surface 14 of the wafer 10 to form the drain 44 and source 46 of the P channel transistor and to form the P+ guardband 42 surrounding the P well 22.

Referring now to FIG. 8, the wafer 10 is again placed in a furnace in order to grow thermal oxide protective layers 40 over the regions 42, 44, 46 in which P type diffusions have been made. Next, a selective etchant for silicon nitride is used to remove the exposed portion of the layer 24 to expose the underlying surface 14 of the wafer 10. Then, a donor impurity, such as phosphorus, is diffused into the openings thus formed in order to form N+ regions including the source 34 and drain 36 of the N channel transistor within the P well 22 and the N+ guardband 38 surrounding the drain 44 and source 46 of the P channel transistor. Following the formation of the N+ regions 34, 36, 38 the silicon dioxide layers 26, 30, 40 are removed and the remaining portions of the silicon nitride layer 24 are removed.

Figure 9:
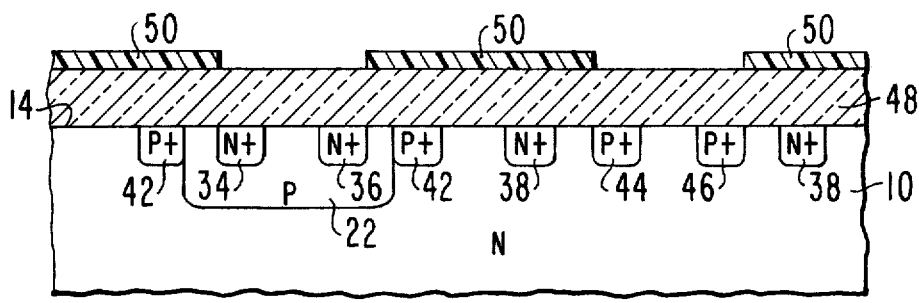

Referring now to FIG. 9, a thick field oxide layer 48 is either deposited or thermally grown over the surface 14 of the wafer 10 and a layer of photoresist material 50 is applied to the surface of the oxide layer 48. Using a fourth photomask (not shown), regions are defined in the photoresist layer 50 overlying active devices and those regions of the photoresist layer 50 are removed. Using an etchant for silicon dioxide, such as a buffered hydrofluoric acid, the exposed regions of the thick field oxide layer 48 are removed to expose the surface 14 of the wafer 10. Then, the remaining portions of the photoresist layer 50 are removed.

Figure 10:
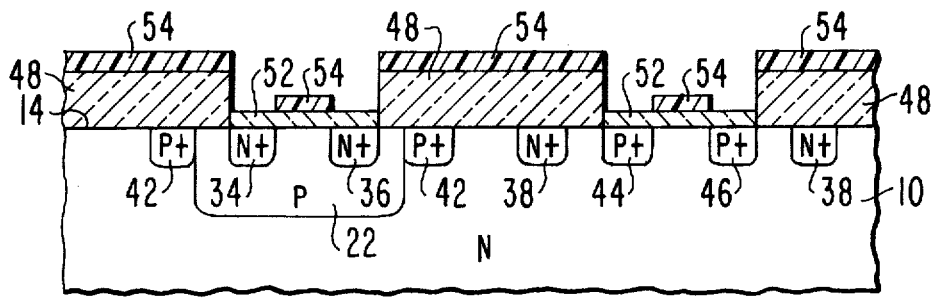

Referring now to FIG. 10, a thin channel oxide layer 52 is grown or deposited over the portions of the wafer which were exposed and a photoresist layer 54 is deposited over the surface of the oxide layers 48 and 52. Using a fifth photomask (not shown), the photoresist layer 54 is defined and the portions of the photoresist layer 54 overlying drains and sources of active devices are removed. The exposed portions of the channel oxide layer 52 are then removed by etching, and the remaining portions of the photoresist layer 54 are removed. A metallic layer 56 such as a layer of aluminum, is deposited uniformly over the surface of the wafer 10, and using a sixth photomask (not shown), the metallic layer 56 is defined to form metallic interconnects and gate contacts. Then, a thick protective oxide layer 58 is deposited uniformly over the surface of the layer and using a seventh photomask (not shown), bond pad openings 60 are formed in the protective oxide layer 58, thereby completing the device to yield the structure shown in FIG. 1.

While the invention has been described herein with reference to a process for manufacturing a COS/MOS device it should be obvious to one of ordinary skill in the semiconductor art that the process can be utilized in manufacturing any type of device which requires both N and P type regions. In addition, the process can be altered to accomplish the N type diffusion before the P type diffusion without departing from the spirit or scope of the invention.

In addition to changing the order of diffusions so that an N type diffusion can be made before a P type diffusion, it is also possible to change the order of the diffusions without changing the locations in which the diffusions will be made. This is accomplished by using a photomask to define the original two layer structure which is the negative of the photomask which has been described herein (or by using the same photomask with photoresist which is photographically opposite that described herein). Accordingly, silicon nitride and silicon dioxide layers are removed only from over the P wells and over the regions where the N+ guardbands would be located. Then, those areas would be recovered with silicon dioxide. Next, the N+ and P+ regions would be defined simultaneously, but the silicon dioxide etch would then expose the substrate over the P-well and the areas where the N+ guardbands would be formed. Following the diffusion of the N+ impurities into the exposed substrate the silicon dioxide can be grown over those exposed substrate areas and the silicon nitride can be opened up to expose the substrate where P+ diffusions will be made. In addition to the changes described herein, other changes can be made by one of ordinary skill in the art without departing from the invention described herein.

I claim:

1. The process of introducing impurities into a substrate of material in the manufacture of a semiconductor device comprising the steps of:
   a. forming a first layer of a first material over said substrate;
   b. forming a second layer of a second material over said first layer, said second material being different from said first material;
   c. preferentially etching portions of said second layer by an etchant which preferentially etches said second material with respect to said first material to expose the underlying portions of said first layer;
   d. removing said exposed portions of said first layer to expose the underlying portions of said substrate;
   e. forming a third layer of said second material over said exposed portions of said substrate;
   f. simultaneously defining selected portions of said second and said third layers, then removing said selected portions of said third layer to expose the underlying portions of said substrate while simultaneously removing said selected portions of said second layer to expose the underlying portions of said first layer, the removal of said selected portions being accomplished by an etchant which preferentially etches said second material with respect to said first material;

g. depositing impurities of a first conductivity type onto the exposed portions of said substrate and introducing said impurities into said substrate h. forming fourth layers of said second material only over the exposed portions of said substrate by reacting said exposed portions of said substrate;

i. removing the remaining said exposed portions of said first layer to expose the underlying portions of said substrate; and j. depositing impurities of a second conductivity type different from said first conductivity type into said exposed portions of said substrate and introducing said impurities into said substrate.

2. The process of claim 1 wherein said semiconductor material comprises silicon and said step of forming a first layer of a first material and said substrate comprises the step of forming a layer of silicon nitride over said substrate.

3. The process of claim 2 wherein said step of forming a second layer of a second material over said first layer comprises the step of forming a layer of silicon dioxide over said layer of silicon nitride.

4. The process of claim 3 wherein said step of forming fourth layers comprises the step of growing silicon dioxide outward from said silicon substrate by placing said substrate into a furnace in an oxidizing ambient.

5. The process of claim 4 wherein said step of simultaneously defining selected portions of said second and said third layers comprises the step of using a single photomask to expose a layer of photoresist and then preferentially etching silicon dioxide with respect to silicon nitride and silicon.

6. The process of claim 5 wherein said step of introducing said impurities of one conductivity type comprises the step of diffusing acceptor type impurities into the exposed portions of said substrate.

7. The process of claim 6 wherein the step of introducing impurities of a conductivity type different from the conductivity type of the impurities introduced into said third layer comprises the step of diffusing donor type impurities into said exposed portions of said substrate.

* * * * *